US007607066B2

(12) United States Patent
Gertz et al.

(10) Patent No.: US 7,607,066 B2
(45) Date of Patent: Oct. 20, 2009

(54) AUTO SUGGESTION OF CODING ERROR CORRECTION

(75) Inventors: Matthew Wayne Gertz, Woodinville, WA (US); Sam Spencer, Redmond, WA (US); Ernest Kien-Keung Tong, Redmond, WA (US); Li Zhang, Woodinville, WA (US)

(73) Assignee: Microsoft Corporation, Redmond, WA (US)

( * ) Notice: Subject to any disclaimer, the term of this patent is extended or adjusted under 35 U.S.C. 154(b) by 842 days.

(21) Appl. No.: 10/183,259

(22) Filed: Jun. 26, 2002

(65) Prior Publication Data

US 2004/0003335 A1 Jan. 1, 2004

(51) Int. Cl.
*H03M 13/49* (2006.01)
*H03M 13/25* (2006.01)

(52) U.S. Cl. ...................... 714/758; 714/723
(58) Field of Classification Search ............ 714/758, 714/752, 38, 746, 799, 25, 42, 724, 723, 714/764, 763, 710, 774, 718; 717/124; 715/700, 715/533
See application file for complete search history.

(56) References Cited

U.S. PATENT DOCUMENTS

| 5,361,351 | A | * | 11/1994 | Lenkov et al. ............ 717/124 |
| 5,774,644 | A | * | 6/1998 | McKinstry ................. 714/25 |
| 6,131,102 | A | * | 10/2000 | Potter ....................... 715/533 |
| 6,424,983 | B1 | * | 7/2002 | Schabes et al. ............ 715/533 |
| 6,593,940 | B1 | * | 7/2003 | Petersen et al. ............ 715/700 |
| 7,050,923 | B2 | * | 5/2006 | Fuller et al. .............. 702/123 |
| 2003/0061600 | A1 | * | 3/2003 | Bates et al. .............. 717/133 |
| 2005/0229154 | A1 | * | 10/2005 | Hiew et al. .............. 717/110 |

OTHER PUBLICATIONS

University of North Texas, Introduction to Microsoft Word 2000, Jun. 1999, Computing Center, pp. 1-62.*
Balance, R.A., et al., "The Pan language-based editing system," *ACM Trans. On Software Eng. And Methodology*, Jan. 1, 1992, 1(1), 95-127.
Hetzel, B., "A perspective on software development," *Proceedings of the 3rd international conference on software engineering*, May 1978, 260-263.
McNamara, B., et al., "Functional programming in C++," *ACM Signplan Notices, proceedings of the fifth ACM Signplan international conference on Functional programming*, Sep. 2000, 35(9), 118-129.
Satratzemi, M., et al., "A system for program visualization and problem-solving path assessment of novice programmers," *Proceedings of the 6th annual conference on Innovation and technology in computer science education*, Jun. 2001, 137-140.

(Continued)

*Primary Examiner*—Kevin L Ellis
*Assistant Examiner*—Dipakkumar Gandhi
(74) *Attorney, Agent, or Firm*—Woodcock Washburn LLP

(57) ABSTRACT

Suggested corrections for a code error are provided by a compiler or code editor, for example. Thus, there is much less ambiguity about how an error should be corrected. Preferably, a predetermined number of suggested corrections are presented to the user (e.g., up to three suggestions), and the user can choose a desired suggested correction. Corrections for a given error can be made, not only at the location of the error, but throughout the code document, or other files in the user's solution. Furthermore, by undoing one correction and trying another, the user can go through all of the suggested corrections to determine which suggestion would be most preferable.

26 Claims, 5 Drawing Sheets

OTHER PUBLICATIONS

Von Praun, C., et al., "Object race detection," *ACM Signplan Notices, Proceedings of the OOPSLA '01 conference on Object Oriented Programming Systems Languages and Applications*, Nov. 2001, 36(11), 70-82.

Wilcox, T.R., et al., "The design and implementation of a table driven, interactive diagnostic programming system," *Communications of the ACM*, Nov. 1976, 19(11), 609-616.

"Quick Fix," http://download.eclipse.org/downloads/documentation/2.0/html/plugins/org.eclipse.jdt.doc.user/reference/ref-java-editor-quickfix.htm, Undated, 2 pages.

"Eclipse Platform Technical Overview," http://www.eclipse.org/ *Object Technology International, Inc.*, Jul. 2001, 21 pages.

"Java Tooling Release Notes," http://64.38.198.171/downloads/drops/R-2.0-200206271835/buildnotes/buildnotes_jdt-ui.html, Jun. 27, 2002, 31 pages.

"The Mind Electric Announces GLUE 3.0 Web Services Platform," Webservices.Org—The Web Services Community Portal, http://www.webservices.org/index.php/article/view/569/1/2, *WebServices.Org™*, Aug. 5, 2002, 2 pages.

"Debugging a WebService using Eclipse and Glue," http://www.angelfire.com/droid/ceperez/webservices.html, Undated, 1 page.

* cited by examiner

```
┌─────────────────────────────────────────────────────────┬────────────┐
│ Code Editor / Compiler                                  │   - □ X    │
├─────────────────────────────────────────────────────────┴────────────┤
│ File   Edit   View   Project   Build   Debug   Tools   Window   Help │
├──────────────────────────────────────────────────┬───────────────────┤
│                                                  │ Solution          │
│ Start Page │        Form1*                       │ Application       │
├────────────────────────┬─────────────────────────┼───────────────────┤
│  Form1        ▼        │   GetInfo      ▼        │ References        │
│                                                  │ Resources         │
│  Class Class1                                    │ AssemblyInfo      │
│      Private Structure MyInfo                    │                   │
│          Dim member1 As Integer                  │                   │
│      End Structure                               │                   │
│                                                  │                   │
│      Public Property GetInfo() As MyInfo         │                   │
│          Get                                     │                   │
│              '...                                │                   │
│          End Get                        307      │                   │
│          Set (ByVal Value As MyInfo)             │                   │
│              '...                                │                   │
│          End Set                                 │                   │
│      End Property                                │                   │
│  End Class                                       │                   │
└──────────────────────────────────────────────────┴───────────────────┘
```

```
Code Editor / Compiler                                    - □ X
File   Edit   View   Project   Build   Debug   Tools   Window   Help Solution
Start Page       Form1*                       Application Form1              ▼    GetInfo         ▼    References
                                              Resources
   Class Class1                               AssemblyInfo
         Private Structure MyInfo
             Dim member1 As Integer
         End Structure Public Property GetInfo() As MyInfo
             Get
         ┌──────────────────────────────────────┐
         │ 'GetInfo()' can't expose a Private type outside │
         │ of the Public class "Class1"         │
         │                                      │
         │ (1) Utilize Private access specifier for 'GetInfo()' │
         │     Private Property GetInfo() As MyInfo │
         │         Get                          │
         │ End (2) Utilize Public access specifier for the structure │
         │     'MyInfo'                         │
         │         Class Class 1                │
         │             Public Structure MyInfo  │
         │                 Dim member1 As Integer │
         └──────────────────────────────────────┘
```

AUTO SUGGESTION OF CODING ERROR CORRECTION

FIELD OF THE INVENTION

This invention relates in general to the field of software. More particularly, this invention relates to error correction of program code.

BACKGROUND OF THE INVENTION

To manage the complexity of long computer programs, computer programmers often adopt object-oriented programming techniques. With these techniques, a computer program is organized as multiple smaller modules called objects. An object is a unit of code comprising both routines and data and is thought of as a discrete entity. These objects perform specified functions and interact with other objects in pre-defined ways. Objects communicate with each other through interfaces. Each object may have multiple interfaces. An interface exposes and defines access to the object's public routines and data. Put another way, an interface can be considered as the definition of an expected behavior and expected responsibilities. One of the advantages to interfaces is that a client object can continue to access the methods of a server object that are exposed through the interface, regardless of whether the underlying code in the object is updated or changed for another reason.

One of the primary benefits of object-oriented programming is that the objects can be easily and affordably adapted to meet new needs by combining them in a modular fashion. The structural foundation for an object-oriented language is the object model. The Component Object Model (COM) produced by Microsoft Corporation of Redmond, Wash., is an example of an object model.

A typical compiler is a computer program that translates a high-level programming language into machine language. The compiler usually converts the high-level language into assembly language first, and then translates the assembly language into machine language. The program fed into the compiler is called the source code; the generated machine language program is called the object code. The compiler looks at the entire piece of source code and collects and reorganizes the instructions.

A conventional compiler or code editor, such as the Visual Basic Code Editor, produced by Microsoft Corporation, indicates a code error to a user by underlining the offending code with a squiggle or other indicator, for example, and/or inserting a line number and class of the error in a tasklist or other window or dialog box. However, the error information is very broad, and is often not sufficient for users to identify the specific cause of the error. Although general information is available about a given error in code, such error information is limited to an error number and a brief string of text describing the error in broad terms. This error information may not be specific enough to help the user identify the problem quickly, particular in the case of novice users.

Because the error information is very general, it can furthermore often be misleading to the user. For example, the ultimate cause of the error might be omission rather than commission. Thus, in some cases, changing code elsewhere in the program code might be the proper way to correct the error, rather than changing code where the error was flagged. Even the online help information which describes the error type in more detail is often not sufficient to help the user correct the error, because it is generally not specific to the user's situation. All of this combines to frustrate and slow down the user.

In view of the foregoing, there is a need for systems and methods that overcome the limitations and drawbacks of the prior art.

SUMMARY OF THE INVENTION

The present invention overcomes these problems by providing systems and methods for a user to quickly repair an error in his code, without requiring the user to be highly knowledgeable about the underlying error concepts. Upon locating an error in the compiler or code editor, at least one suggested correction is provided to the user, preferably via an error correction interface. The user can select a suggested correction. The system then corrects the error in the current line of code (i.e., locally) using the selected suggested correction, and also corrects other problems, errors, or issues throughout the code that are related to the initial error.

According to aspects of the invention, a correction to an error might not be made to the line of code that is highlighted as being erroneous, but instead the correction may be elsewhere in the code file, a related project, or a related collaboration of projects.

Additional features and advantages of the invention will be made apparent from the following detailed description of illustrative embodiments that proceeds with reference to the accompanying drawings.

BRIEF DESCRIPTION OF THE DRAWINGS

The foregoing summary, as well as the following detailed description of preferred embodiments, is better understood when read in conjunction with the appended drawings. For the purpose of illustrating the invention, there is shown in the drawings exemplary constructions of the invention; however, the invention is not limited to the specific methods and instrumentalities disclosed. In the drawings:

FIG. 3 is a diagram of an exemplary high level screen shot with a highlighted code error in accordance with the present invention;

FIG. 4 is a diagram of an exemplary high level screen shot with an error correction interface window in accordance with the present invention.

DETAILED DESCRIPTION OF PREFERRED EMBODIMENTS

Overview

The present invention is directed to systems and methods that provide automatic suggestion of corrections to code errors detected by a compiler, code editor, or other computer program. The present invention can be implemented in a variety of languages and tools such as Visual Basic, Visual C++, Visual FoxPro, all produced by Microsoft Corporation. Moreover, the invention can be used with other languages, tool, and object models (e.g., objects designed according to the Common Object Request Broker Architecture (CORBA) or according to Sun Microsystems' Java specifications).

The present invention is directed to systems and methods that provide suggested corrections or solutions for a user's code error in the context of his own code; thus, there is much less ambiguity about how an error should be corrected. Preferably, a predetermined number of suggestions are presented to the user (e.g., up to three suggestions), and the user can choose a desired suggested correction (e.g., the solution that is most in line with his design ideas). Corrections for a given error can be made, not only at the location of the error, but throughout the code document. Furthermore, by undoing one correction and trying another, the user can go through all of the suggestions to determine which suggested correction would be most preferable.

Exemplary Computing Environment

Figure 1:
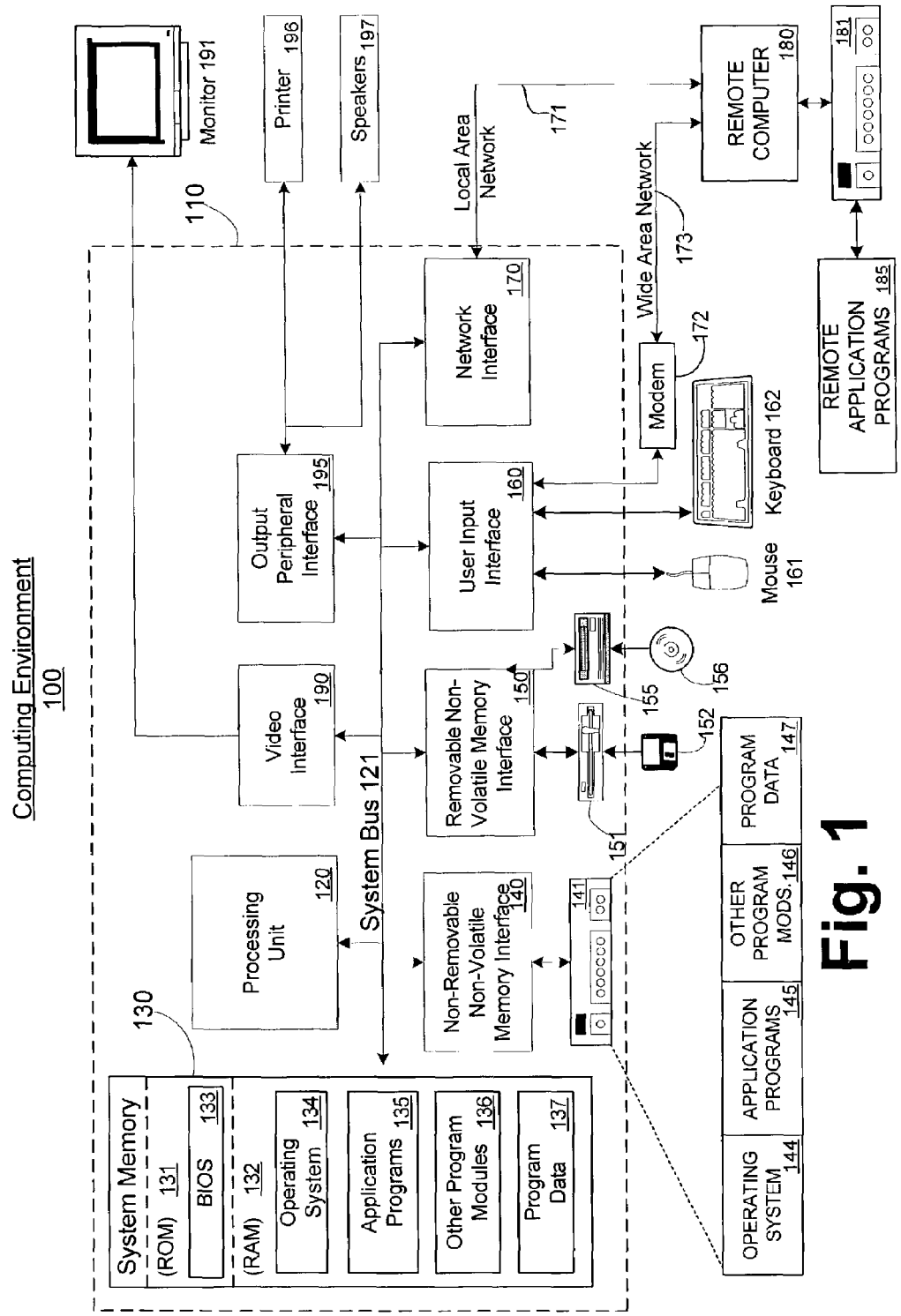
FIG. 1 is a block diagram showing an exemplary computing environment in which aspects of the invention may be implemented.

FIG. 1 illustrates an example of a suitable computing system environment 100 in which the invention may be implemented. The computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 100.

The invention is operational with numerous other general purpose or special purpose computing system environments or configurations. Examples of well known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The invention may be described in the general context of computer-executable instructions, such as program modules, being executed by a computer. Generally, program modules include routines, programs, objects, components, data structures, etc. that perform particular tasks or implement particular abstract data types. The invention may also be practiced in distributed computing environments where tasks are performed by remote processing devices that are linked through a communications network or other data transmission medium. In a distributed computing environment, program modules and other data may be located in both local and remote computer storage media including memory storage devices.

With reference to FIG. 1, an exemplary system for implementing the invention includes a general purpose computing device in the form of a computer 110. Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus).

Computer 110 typically includes a variety of computer readable media. Computer readable media can be any available media that can be accessed by computer 110 and includes both volatile and non-volatile media, removable and non-removable media. By way of example, and not limitation, computer readable media may comprise computer storage media and communication media. Computer storage media includes both volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer 110. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

The system memory 130 includes computer storage media in the form of volatile and/or non-volatile memory such as ROM 131 and RAM 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 1 illustrates operating system 134, application programs 135, other program modules 136, and program data 137.

The computer 110 may also include other removable/non-removable, volatile/non-volatile computer storage media. By way of example only, FIG. 1 illustrates a hard disk drive 140 that reads from or writes to non-removable, non-volatile magnetic media, a magnetic disk drive 151 that reads from or writes to a removable, non-volatile magnetic disk 152, and an optical disk drive 155 that reads from or writes to a removable, non-volatile optical disk 156, such as a CD-ROM or other optical media. Other removable/non-removable, volatile/non-volatile computer storage media that can be used in the exemplary operating environment include, but are not limited to, magnetic tape cassettes, flash memory cards, digital versatile disks, digital video tape, solid state RAM, solid state ROM, and the like. The hard disk drive 141 is typically connected to the system bus 121 through a non-removable memory interface such as interface 140, and magnetic disk drive 151 and optical disk drive 155 are typically connected to the system bus 121 by a removable memory interface, such as interface 150.

The drives and their associated computer storage media, discussed above and illustrated in FIG. 1, provide storage of computer readable instructions, data structures, program modules and other data for the computer 110. In FIG. 1, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies. A user may enter commands and information into the computer 110 through input devices such as a keyboard 162 and pointing device 161, commonly referred to as a mouse, trackball or touch pad. Other input devices (not shown) may include a microphone, joystick, game pad, satellite dish, scanner, or the like. These and other input devices are often connected to the processing unit 120 through a user input interface 160 that is coupled to the system bus, but may be connected by other interface and bus structures, such as a parallel port, game port or a universal serial bus (USB). A monitor 191 or other type of display device is also connected to the system bus 121 via an interface, such as a video interface 190. In addition to the monitor, computers may also include other peripheral output devices such as speakers 197 and printer 196, which may be connected through an output peripheral interface 190.

The computer 110 may operate in a networked environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 1. The logical connections depicted include a local area network (LAN) 171 and a wide area network (WAN) 173, but may also include other networks. Such networking environments are commonplace in offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 1 illustrates remote application programs 185 as residing on memory device 181. It will be appreciated that the network connections shown are exemplary and other means of establishing a communications link between the computers may be used.

Exemplary Distributed Computing Frameworks or Architectures

Various distributed computing frameworks have been and are being developed in light of the convergence of personal computing and the Internet. Individuals and business users alike are provided with a seamlessly interoperable and Web-enabled interface for applications and computing devices, making computing activities increasingly Web browser or network-oriented.

For example, MICROSOFT®'s .NET platform includes servers, building-block services, such as Web-based data storage and downloadable device software. Generally speaking, the .NET platform provides (1) the ability to make the entire range of computing devices work together and to have user information automatically updated and synchronized on all of them, (2) increased interactive capability for Web sites, enabled by greater use of XML rather than HTML, (3) online services that feature customized access and delivery of products and services to the user from a central starting point for the management of various applications, such as e-mail, for example, or software, such as Office .NET, (4) centralized data storage, which will increase efficiency and ease of access to information, as well as synchronization of information among users and devices, (5) the ability to integrate various communications media, such as e-mail, faxes, and telephones, (6) for developers, the ability to create reusable modules, thereby increasing productivity and reducing the number of programming errors, and (7) many other cross-platform integration features as well.

While exemplary embodiments herein are described in connection with software residing on a computing device, one or more portions of the invention may also be implemented via an operating system, application programming interface (API) or a "middle man" object between a coprocessor and requesting object, such that the automatic suggestion of error correction may be performed by, supported in, or accessed via all of .NET's languages and services, and in other distributed computing frameworks as well.

Exemplary Embodiments

The present invention provides systems and methods via an interface (referred to herein as an error correction interface) for a user to repair a detected error in his code, pursuant to at least one suggested correction provided to the user. The user can select a suggested correction, and then the system corrects the error in the current line of code (i.e., locally) or at other locations in the code, and also corrects other problems, errors, or issues throughout the code that are related to the initial error.

In many situations, the system will be able to determine the cause of a coding error. If this is the case, the system offers potential solutions to the user. If the cause of an error cannot be determined, or if no suggestion can be provided, an indicator is activated, alerting the user that an error is present, that no suggested corrections are available, and/or directing the user to an online help directory for further information, for example.

Figure 2:
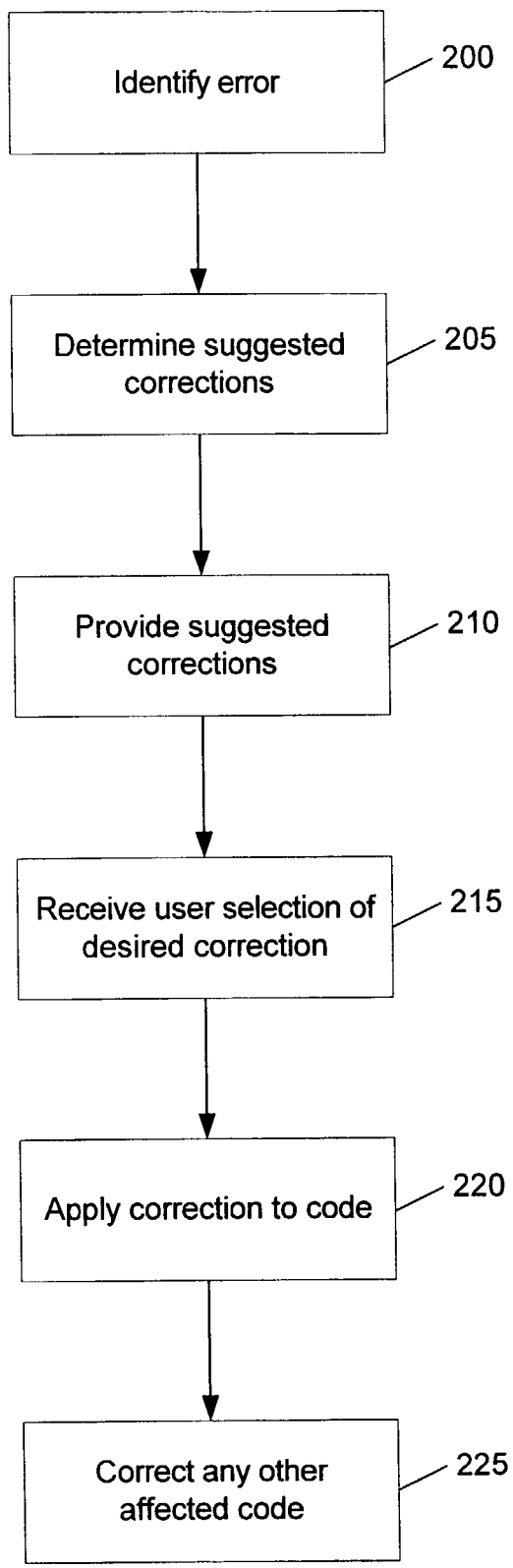
FIG. 2 is a flow diagram of an exemplary method of error correction in accordance with the present invention.
Figure 5:
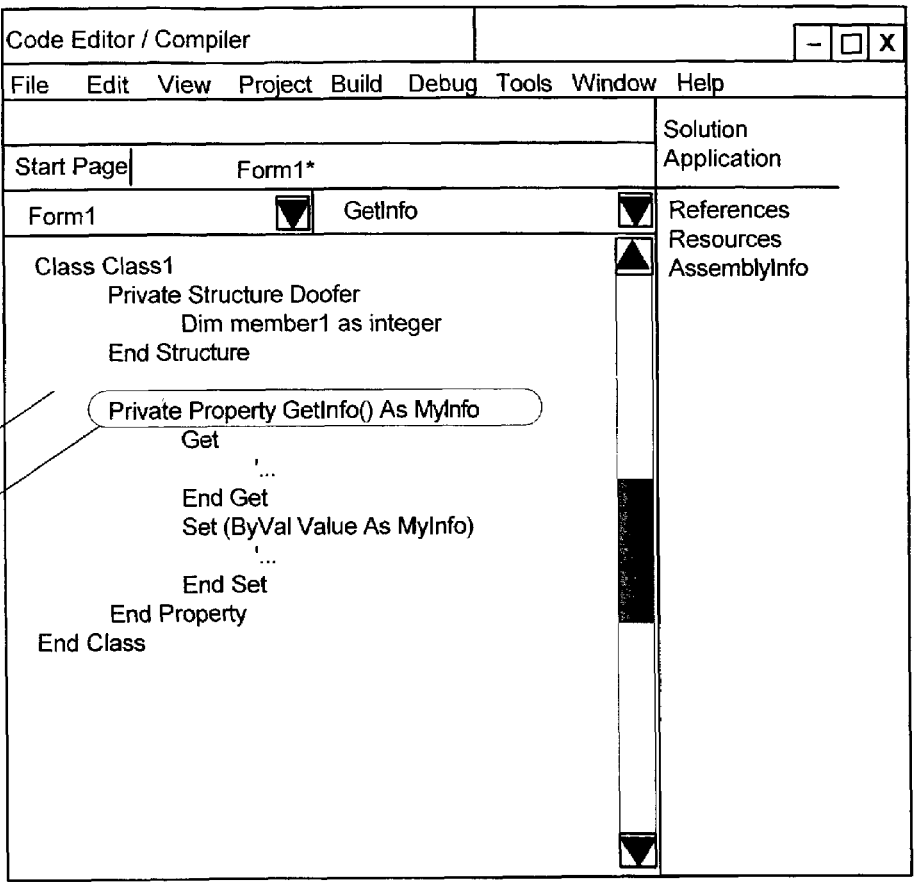
FIG. 5 a diagram of an exemplary high level screen shot with replacement code in accordance with the present invention.

FIG. 2 is a flow diagram of an exemplary method of error correction in accordance with the present invention, and FIGS. 3-5 are diagrams of exemplary high level screenshots at various stages of the error correction process and are useful in describing the present invention.

Initially, the code is compiled by the compiler, edited by the code editing program, or otherwise acted upon by the underlying program in order to detect an error in the code. At step 200, an error is detected and identified.

For example, assume that a user has written the following code to create a class:

```
Class Class1
    Private Structure MyInfo
        Dim member1 as Integer
    End Structure
    Public Property GetInfo( ) As MyInfo
        Get
            '...
        End Get
        Set (ByVal Value As MyInfo)
            '...
        End Set
    End Property
End Class
```

This code is shown on the screen shot 300 in FIG. 3, and in particular, in the code window 305. This code is in error, because "MyInfo" is a private type and cannot be exposed in a public method. As shown in FIG. 3, "MyInfo" is underlined with a squiggly line 307 in the property declaration to indicate that this code has an error. Thus, at step 200, an error in the code is detected and indicated by a squiggly line or other indicator, for example.

The system determines whether the error is fixable. There is a library (e.g., a table) of all the errors that tell whether the error is fixable or not. The table also tells what actions can be taken to correct the error for which suggested corrections are available. Thus, at step 205, suggested corrections for the error are determined. Preferably, the system retrieves the error information for the line of code containing the error from associated error tables, and notes the type of the error. For example, a compiler takes the line number and searches though its compiler parse tree for the symbols on that line, and notes that the "MyInfo" symbol is in error due to accessibility of "GetInfo( )". The system is coded so that it knows that accessibility errors can be fixed by matching the accessibility qualifiers of the two symbols in question.

Internally, the suggestions for error corrections are determined by examining the symbol information in the compiler or code editor, for example. There is a specific set of errors for which the error correction interface can determine corrections (e.g., syntax and semantic errors). The symbol information in the compiler is inspected to determine the symbols involved, the lines where they are defined, and the lines where they are used. This information is combined with the type of the error, and a presentation of alternatives is made to the user at step 210.

At this point, as shown in FIG. 4, an error correction interface 310 in FIG. 4, such as a window or dialog box, is provided to the user. The interface 310 can be activated automatically or can be invoked by the user taking an affirmative step, such as, for example, such as moving the cursor over the code with the squiggly line and clicking, accessing a tasklist window, or clicking on a provided error indicator or icon, etc. The dialog box or window 310 is provided preferably near the offending code, and states there is an error. A predetermined number (e.g., up to three) of possible solutions for resolving the problem is provided.

The interface 310 comprises a header or panel 315 that contains information regarding the error (e.g., in this example, "'GetInfo( )' can't expose a Private type outside the Public class 'Class 1.'") The interface 310 also comprises an error resolution window 320 in which suggested corrections are provided (step 210). The resulting suggestions are shown to the user as they would appear in code. The error correction interface 310 also optionally comprises buttons or a scroll bar to navigate through the list of current errors and/or suggested corrections.

In window 320, two suggested corrections are provided, both of which are acceptable solutions to the error. At step 215, the user selects the desired correction by clicking on the desired correction, or highlighting the desired correction and selecting an "Apply" button (not shown), for example. The selected error correction is applied to the code.

In window 320, the list of suggested corrections can be sorted and displayed in a particular order (i.e., ranked); e.g., the most recently used can be shown first, the most frequently or commonly used can be shown first, etc.

In some cases, there is only one suggested correction. In such a case, the single suggested correction is displayed in the window 320. It is noted that in such a case, the single suggested correction is preferably not automatically applied to the code. The user is still provided with the single suggested correction and desirably selects it in order to revise the code in accordance with the single suggested correction.

Some errors will have no suggestions for a correction. In such a case, there is no indication provided to the user that a suggested correction exists. The offending code will still be indicated, e.g., by a squiggly underline or other indicator. Alternately, a message can be displayed explaining that there are no suggested fixes for the error. Optionally, the user can be directed to an online help directory to be provided with additional information regarding the error.

At step 220, the selected correction is applied to the code. The changes are desirably made to the code automatically and immediately. In this example, the user has selected the "(1) Utilize Private access specifier for 'GetInfo( )'" correction and it has been applied as shown in line 330 in FIG. 5.

Any other code that is related to the error that has been corrected is then fixed at step 225. For the error, all occurrences of the error in the code that need to be fixed or are otherwise affected are fixed. According to an embodiment, the compiler symbol tables are used with the compiler's parse tree to locate all uses of the symbols in questions, so that if "MyInfo" was used elsewhere in the code in an access specific manner which would need to be changed as a result of these suggestions, the resulting changes would also be determined.

Moreover, changes across different files can be made automatically without the user having to open the related files where the same change or a related change needs to be made.

It should be noted that the fix may occur elsewhere in the code. For example, the error may be shown as occurring at line A, but the fix is at line B.

After the code has been changed with the selected suggested correction, the system will then re-examine the code, switch to the next remaining error, and so on, until there are no more errors or the dialog is dismissed by the user.

If there are any new errors generated in the process of applying the selected suggested correction, then the first of these errors is preferably used as the next error to be fixed. As such, any further error(s) that is introduced by the applied correction are then highlighted and treated as described above, starting with step 200.

Preferably, the user also has the option of undoing the last error correction (e.g., by clicking an "undo" button (not shown), and also has the option of bringing up specific help on the class of error via another button.

Some programs distinguish between "warnings" and "errors", wherein warnings are not fatal (they will compile, for example) and errors are fatal. In such a case, it is contemplated that a user can select whether or not to receive suggested corrections for warnings as well as for errors.

As mentioned above, while exemplary embodiments of the present invention have been described in connection with various computing devices and network architectures, the underlying concepts may be applied to any computing device or system in which it is desirable to provide error correction of code to a user. Thus, the techniques for error correction in accordance with the present invention may be applied to a variety of applications and devices. For instance, aspects of the invention may be applied to the operating system of a computing device, provided as a separate object on the device, as part of another object, as a downloadable object from a server, as a "middle man" between a device or object and the network, as a distributed object, etc. While exemplary programming languages, names and examples are chosen herein as representative of various choices, these languages, names and examples are not intended to be limiting.

The various techniques described herein may be implemented in connection with hardware or software or, where appropriate, with a combination of both. Thus, the methods and apparatus of the present invention, or certain aspects or portions thereof, may take the form of program code (i.e., instructions) embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. In the case of program code execution on programmable computers, the computing device will generally include a processor, a storage medium readable by the processor (including volatile and non-volatile memory and/or storage elements), at least one input device, and at least one output device. One or more programs that may utilize the suggested error correction aspects of the present invention, e.g., through the use of a data processing API or the like, are preferably implemented in a high level procedural or object oriented programming language to communicate with a computer system. However, the program(s) can be implemented in assembly or machine language, if desired. In any case, the language may be a compiled or interpreted language, and combined with hardware implementations.

The methods and apparatus of the present invention may also be practiced via communications embodied in the form of program code that is transmitted over some transmission medium, such as over electrical wiring or cabling, through fiber optics, or via any other form of transmission, wherein, when the program code is received and loaded into and executed by a machine, such as an EPROM, a gate array, a programmable logic device (PLD), a client computer, a video recorder or the like, or a receiving machine having the capabilities as described in exemplary embodiments above becomes an apparatus for practicing the invention. When implemented on a general-purpose processor, the program code combines with the processor to provide a unique apparatus that operates to invoke the functionality of the present invention. Additionally, any storage techniques used in connection with the present invention may invariably be a combination of hardware and software.

While the present invention has been described in connection with the preferred embodiments of the various figures, it is to be understood that other similar embodiments may be used or modifications and additions may be made to the described embodiment for performing the same function of the present invention without deviating therefrom. One skilled in the art will recognize that the present invention is not limited to the environment of the exemplary embodiments described herein, and that the methods, as described in the present application may apply to any computing device or environment, such as a gaming console, handheld computer, portable computer, etc., whether wired or wireless, and may be applied to any number of such computing devices connected via a communications network, and interacting across the network. Furthermore, it should be emphasized that a variety of computer platforms, including handheld device operating systems and other application specific operating systems are contemplated, especially as the number of wireless networked devices continues to proliferate. Still further, the present invention may be implemented in or across a plurality of processing chips or devices, and storage may similarly be effected across a plurality of devices. Therefore, the present invention should not be limited to any single embodiment, but rather should be construed in breadth and scope in accordance with the appended claims.

What is claimed is:

1. In a computer system having a graphical user interface including a display and a user interface selection device, a method of correcting a code error in a code listing, comprising the steps of:

determining at least one suggested correction for the code error;

generating an error resolution window on the display comprising a predetermined number of suggested corrections in a ranked order as the suggested corrections would appear in the code listing;

receiving a selection signal indicative of the user interface selection device selecting one of the suggested corrections;

correcting the code error in the code listing responsive to the selected suggested correction; and correcting another occurrence of the code error automatically according to the selected suggested correction.

2. The method of claim 1, further comprising providing an indication on the display regarding the identified code error.

3. The method of claim 1, further comprising determining whether at least one suggested correction for the code error exists prior to determining the at least one suggested correction for the code error.

4. The method of claim 3, further comprising providing an indication on the display if at least one suggested correction for the code error does not exist.

5. The method of claim 3, wherein determining whether at least one suggested correction for the code error exists comprises accessing a previously generated table comprising a plurality of errors and associated suggested corrections.

6. The method of claim 1, wherein correcting the code error in the code listing responsive to the selected suggested correction further comprises automatically correcting any other code across different files that are related to the code error.

7. The method of claim 1, further comprising determining whether the selected suggested correction generates any further errors in the code listing.

8. The method of claim 1, further comprising receiving a selection signal indicative of the user interface selection device selecting the undoing of the correcting of the code error responsive to the selected suggested correction, and undoing the correcting of the code error.

9. A computer-readable medium having computer-executable instructions for performing steps for correcting a code error in a code listing comprising:

determining at least one suggested correction for the code error;

generating an error resolution window on a display and comprising a predetermined number of suggested corrections in a ranked order as the suggested corrections would appear in the code listing;

receiving a selection signal indicative of a user interface selection device selecting one of the suggested corrections; and correcting the code error in the code listing responsive to the selected suggested correction; and correcting another occurrence of the code error automatically according to the selected suggested correction.

10. The computer-readable medium of claim 9, having further computer-executable instructions for providing an indication on the display regarding the identified code error.

11. The computer-readable medium of claim 9, having further computer-executable instructions for determining whether at least one suggested correction for the code error exists prior to determining the at least one suggested correction for the code error.

12. The computer-readable medium of claim 11, having further computer-executable instructions for providing an indication on the display if at least one suggested correction for the code error does not exist.

13. The computer-readable medium of claim 11, wherein determining whether at least one suggested correction for the code error exists comprises accessing a previously generated table comprising a plurality of errors and associated suggested corrections.

14. The computer-readable medium of claim 9, wherein correcting the code error in the code listing responsive to the selected suggested correction further comprises automatically correcting any other code across different files that are related to the code error.

15. The computer-readable medium of claim 9, having further computer-executable instructions for determining whether the selected suggested correction generates any further errors in the code listing.

16. The computer-readable medium of claim 9, having further computer-executable instructions for receiving a selection signal indicative of the user interface selection device selecting the undoing of the correcting of the code error responsive to the selected suggested correction, and undoing the correcting of the code error.

17. An error correction interface for use with a code window and an error in a code listing displayed in the code window, comprising:
 a header comprising information about the error; and
 at least one suggested correction for the error displayed in a ranked order as the at least one suggested correction would appear in the code listing, wherein after a suggested correction is selected, the error is corrected in the code, and wherein another occurrence of the error is automatically corrected according to the selected suggested correction.

18. The error correction interface of claim 17, further comprising at least one of a button and a scroll bar for navigating through the at least one suggested correction.

19. A system for correcting a code error in a code listing of programming language code, comprising:
 a module that receives the code listing;
 a display that displays the code listing; and
 a processor that identifies the code error in the code listing, determines at least one suggested correction for the code error, and provides the at least one suggested correction to the display for display in a ranked order as the at least one suggested correction would appear in the code listing in an error resolution window overlaying the code listing, the processor correcting the code error responsive to a selected suggested correction, wherein another occurrence of the error is automatically corrected according to the selected suggested correction.

20. The system of claim 19, wherein the processor directs the display to display an indication regarding the identified code error.

21. The system of claim 19, wherein the processor determines whether at least one suggested correction for the code error exists.

22. The system of claim 21, wherein the processor directs the display to display an indication if at least one suggested correction for the code error does not exist.

23. The system of claim 21, further comprising a storage device for storing a table comprising a plurality of errors and associated suggested corrections, the processor accessing the storage device in determining whether at least one suggested correction for the code error exists.

24. The system of claim 19, wherein the processor automatically corrects any other code across different files that are related to the code error.

25. The system of claim 19, wherein the processor determines whether the selected suggested correction generates any further errors in the code listing.

26. The system of claim 19, wherein the processor undoes the correction of the code error responsive to a received undo command.

* * * * *